United States Patent [19]

Jeng et al.

[11] Patent Number: 5,652,061
[45] Date of Patent: Jul. 29, 1997

[54] DEVICES COMPRISING FILMS OF β-$C_3N_4$

[75] Inventors: Guang-kai David Jeng, North Plainfield; James Winfield Mitchell, Somerset, both of N.J.

[73] Assignee: Lucent Technologies Inc., Murray Hill, N.J.

[21] Appl. No.: 445,476

[22] Filed: May 22, 1995

[51] Int. Cl.⁶ ................. B32B 9/00; B32B 9/04; C01B 21/06
[52] U.S. Cl. ............ 428/408; 428/446; 428/698; 428/699; 428/704; 423/364; 423/384
[58] Field of Search ................. 428/408, 195, 428/446, 698, 699, 704; 423/364, 384

[56] References Cited

U.S. PATENT DOCUMENTS 5,110,679  5/1992  Haller et al. ............. 428/408

OTHER PUBLICATIONS

A.Y. Liu et al. "Prediction of New Low Compressibility Solids", *Science*, pp. 841–842 (Aug. 1989).
K.M. Yu, et al. "Observation of crystalline $C_3N_4$", *The American Physical Society*, vol. 49, No. 7, pp. 5034–5037 (Feb. 1994).
C. Niu, et al. "Experimental Realization of the Covalent Solid Carbon Nitride", *Science*, vol. 261, pp. 334–337, (Jul. 1993).

M.Y. Chen, et al. "Growth and characterization of C–N thin films", *Surface and Coatings Technology*, 54/55, pp. 360–364 (1992).

*Primary Examiner*—Patrick Ryan
*Assistant Examiner*—Cathy F. Lam
*Attorney, Agent, or Firm*—Glen E. Books; Patricia A. Verlangieri

[57] ABSTRACT

The present inventors have discovered how to make continuous films of single-phase crystalline β-$C_3N_4$ using microwave plasma chemical vapor transport. The films are hard, translucent nanocrystalline films useful for protecting a substrate.

3 Claims, 4 Drawing Sheets

5,652,061

DEVICES COMPRISING FILMS OF β-C₃N₄

FIELD OF THE INVENTION

This invention relates to devices comprising films of β-C₃N₄ and to a method for making such devices. The films provide a substrate with a protective layer of translucent material having a hardness which can exceed that of diamond, a high energy bandgap and ultraviolet (UV) light transparency. They can be formed on a substrate by microwave plasma chemical vapor transport.

BACKGROUND OF THE INVENTION

Carbon nitride, C₃N₄, can exist in two possible phases designated α-C₃N₄ and β-C₃N₄. It has long been predicted that crystals of β-C₃N₄, if they could be made, would possess exotic characteristics such as a hardness exceeding that of diamond, a high energy bandgap and transparency to UV light. Unfortunately, efforts to synthesize this material have produced only amorphous material or impure carbon-rich phases. A continuous coating of crystalline β-C₃N₄ has not heretofore been obtained, and films exhibiting the predicted properties have not been realized.

SUMMARY OF THE INVENTION

The present inventors have discovered how to make continuous films of single-phase crystalline β-C₃N₄ using microwave plasma chemical vapor transport. The films are hard, translucent nanocrystalline films useful for protecting a substrate.

BRIEF DESCRIPTION OF THE DRAWINGS

The advantages, nature and various additional features of the invention are described in detail in connection with the accompanying drawings. In the drawings.

It is to be understood that these drawings are for purposes of illustrating the concepts of the invention and, except for graphical illustrations and photographs, are not to scale.

DETAILED DESCRIPTION

Figure 1:
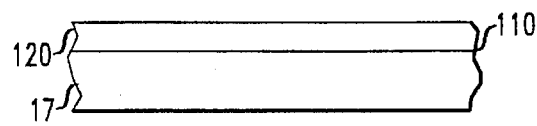
FIG. 1 is a cross section of a substrate having a surface coated with a continuous film of β-C₃N₄.

Referring to the drawings, FIG. 1 is a cross sectional illustration of a substrate 10 having a surface 11 coated with a continuous film 12 of β-C₃N₄. The material of film 12 approaches the ideal composition of C₃N₄ having a typical stoichiometry of 43% carbon, 49–54% nitrogen and, in air, 3–9% oxygen. The film is translucent with a light yellow or olive coloration. Crystallization and the lattice spacings of single-phase β-C₃N₄ are manifested by electron diffraction from the film.

The substrate can be a semiconductor, such as silicon, for which the film can provide a protective coating or a metal, such as steel, for which the film provides hard cutting or wear-resistant surface. On semiconductor or insulating substrates the film is also useful as a protective window permitting influx of ultraviolet light.

Figure 2:
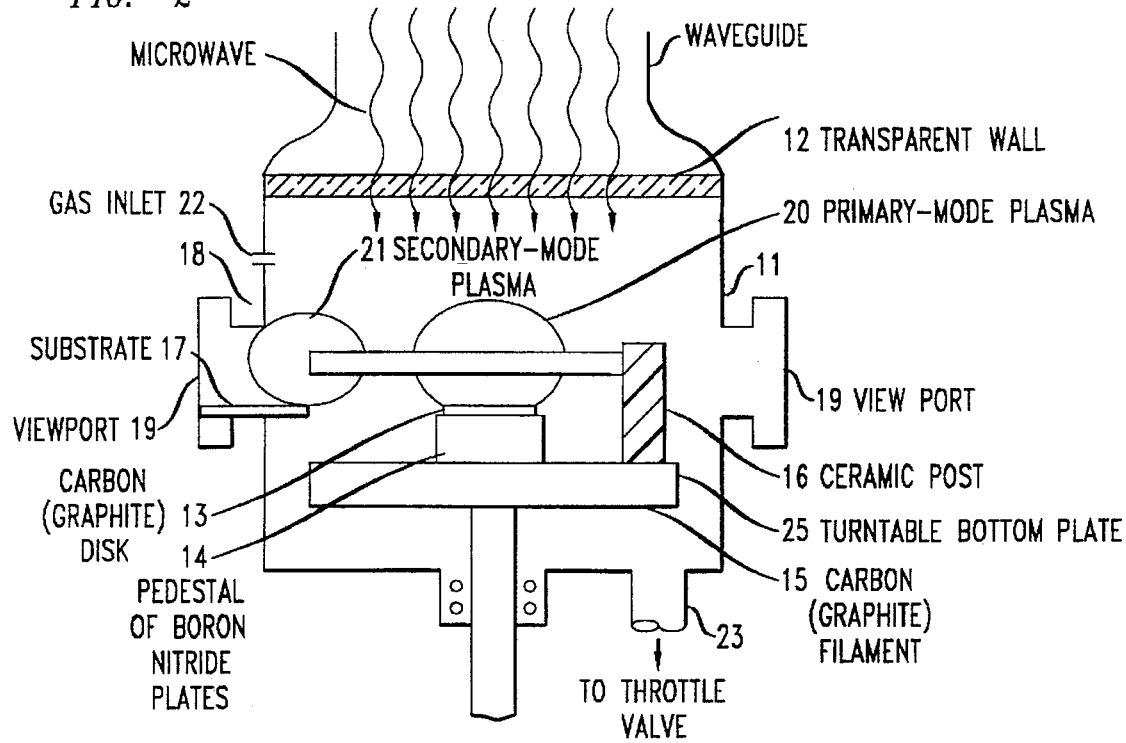
FIG. 2 is a schematic illustration of apparatus useful in making the coated substrate of FIG. 1.

FIG. 2 illustrates apparatus useful in making the product of FIG. 1 comprising a plasma reactor 10 composed of an evacuable chamber 11 having a microwave transparent wall 12 such as a quartz window. The reactor is a modified Vactronic Laboratories Model M-60. Within the chamber 11, mounted on a turnable bottom plate are a carbon (graphite) disk 13 supported by a pedestal 14 of boron nitride plates and a carbon (graphite) filament 15 supported horizontally by a ceramic post 16. The substrate 17 was placed in the duct 18 linking a viewport 19 to the wall of chamber 11. The graphite filament and silicon strip are aligned along the cavity center line with the filament 7–15 mm above the substrate.

Microwave energy passing through wall 12 can produce two plasma modes individually or simultaneously. The primary-mode plasma 20 produces a broad reaction with the center region of the filament at the temperature range 900°–1050° C. The secondary-mode plasma 21 is generated at the free-suspended tip of the filament 15 at a temperature range 650°–850° C.

The reactor is equipped with a gas inlet 22 in the upstream section. Through the inlet a number of different gases can be introduced into the reactor. The flow rate of each gas can be independently controlled by a flow-rate controller (not shown). The reactor is also equipped with a pumping system (not shown) in the downstream section. Gas can be pumped out from the reactor through outlet 23 and a throttle valve (not shown). The preferred gases are nitrogen and helium.

Typical operating parameters for β-C₃N₄ synthesis are 650 watts of microwave power in the cylindrical $TM_{01}$ mode, nitrogen flow at 50–200 sccm, and helium flow at 100–300 sccm. The preferred flow ratio is N₂/He in the range 33–60%. The graphite temperature at the center region is 650°–900° C. and at the free suspended tip, 650°–900° C. The substrate temperature is estimated at 300°–500° C.

An exemplary run involves setting the helium and nitrogen to preset flow rates of 200 sccm He, 75 sccm N₂. The reactor pressure is set to a preset level of 120 torr, and the gas and pressure controllers are turned on. Until the flows and pressure are stabilized, the throttle valve maintains the reactor in a constant pressure range, and all gases maintain a constant flow rate.

The high voltage of the microwave power supply is turned on, and the plasma is ignited in the primary and secondary modes. These two modes of plasma heat the graphite filament to a temperature in the range 600°–1100° C., and synthesis of the β-C₃N₄ coating begins.

Applicants attribute crystallization of β-C₃N₄ to the generation by the microwave plasma of carbon-nitrogen radicals such as CN*. CN* is believed to be the key precursor leading to β-C₃N₄ crystallization. Each of the CN* species can provide up to two unpaired electrons on the N side and up to 3 unpaired electrons on the C side, providing a strong tendency to bond CN* species together to form a lattice structure of β-C₃N₄. This deposition takes place at the lower end of a temperature gradient (600°–1100° C).

After deposition of a desired thickness, the high voltage of the microwave power is turned off. The gas flow is maintained until the reactor cools. After cooling, the gases are turned off, and the reactor is vented.

Figure 3:
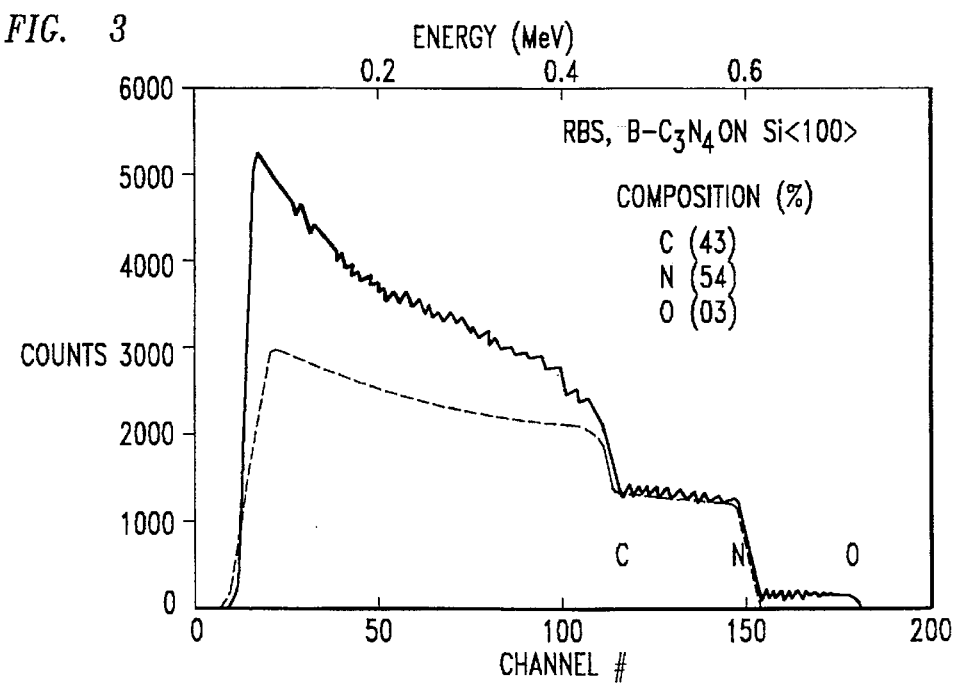
FIG. 3 is a Rutherford backscattering spectrum for a typical film.

The resulting films showed clear evidence for the crystallization of β-C₃N₄. FIG. 3 is a typical Rutherford backscattering spectroscopy (RBS) spectrum of the film. RUMP fitting shows a composition of 43% carbon, 54% nitrogen and 3% oxygen.

Figure 4:
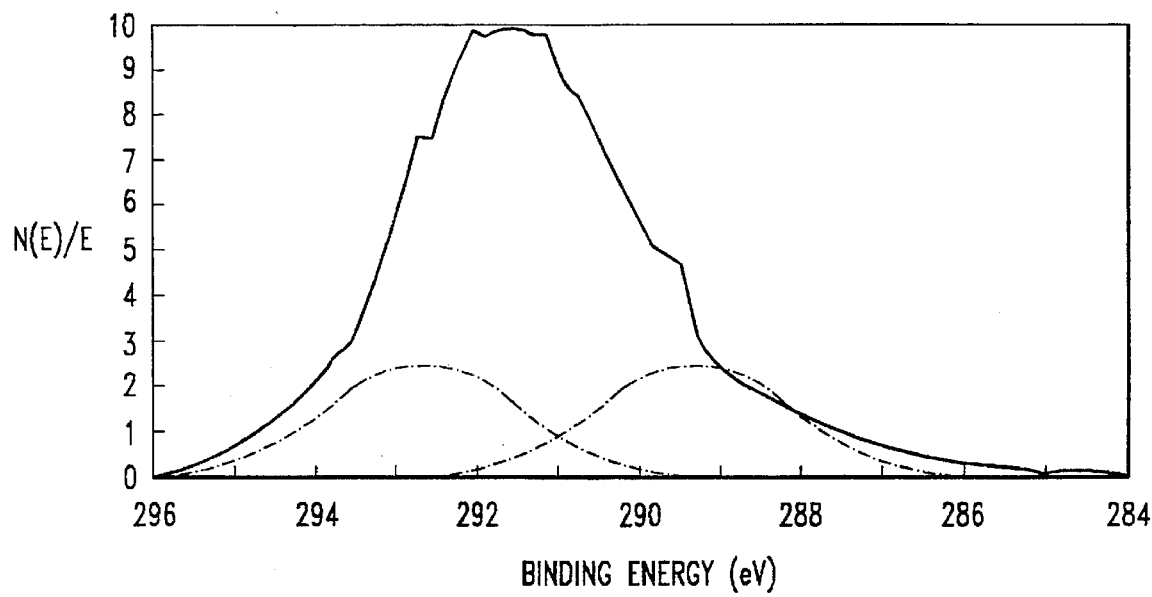
FIGS. 4 and 5 are X-ray photoelectron spectra for carbon and nitrogen in the film.

FIG. 4 is a deconvoluted X-ray photoelectron spectroscopy (XPS) spectrum for carbon. It shows three C 1s features: the feature at 285.0 eV, interpreted as C—C, accounts for 16% of the C 1s intensity. The feature at 288.0 eV is attributed to the formation of C—N bonds and accounts for 67% of the C 1s intensity. The third feature at 289.7 eV probably reflects reaction with oxygen and accounts for 17% of the C 1s intensity.

Figure 5:
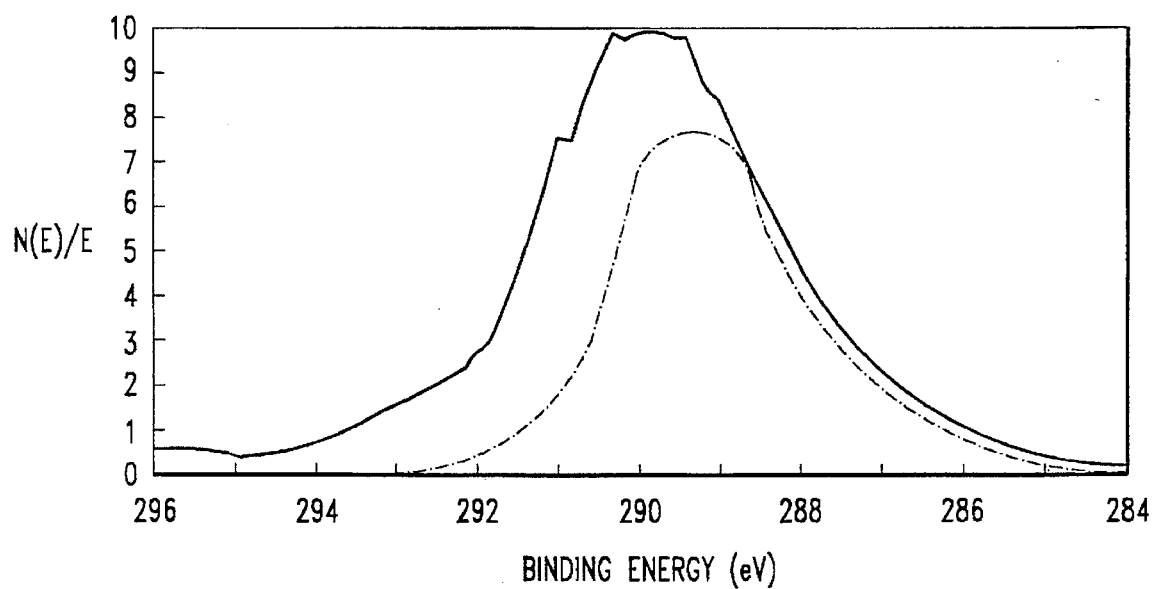

FIG. 5 is a deconvoluted XPS spectrum for nitrogen showing two features in the N 1s spectrum. The low energy feature at 398.6 eV is attributable to $N^1$ and accounts for 59% of the intensity. The higher energy feature at 400.5 eV attributable to $N^2$ accounts for 41% of the intensity.

Figure 6:
FIG. 6 is a TEM microphotograph of the film.

FIG. 6 is a cross section image of the film taken by transmission electron microscopy (TEM). An amorphous layer grows at the bottom and a crystalline layer grows at the top. The growth morphology is columnar, and the boundary is well-defined.

Figure 7:
FIG. 7 is a dark field TEM microphotograph.

FIG. 7 is a dark field TEM image of the same area shown in FIG. 6. FIG. 7 shows crystallization of the continuous top layer and discrete nano-crystals embedded in the amorphous layer grown on the bottom.

Figure 8:
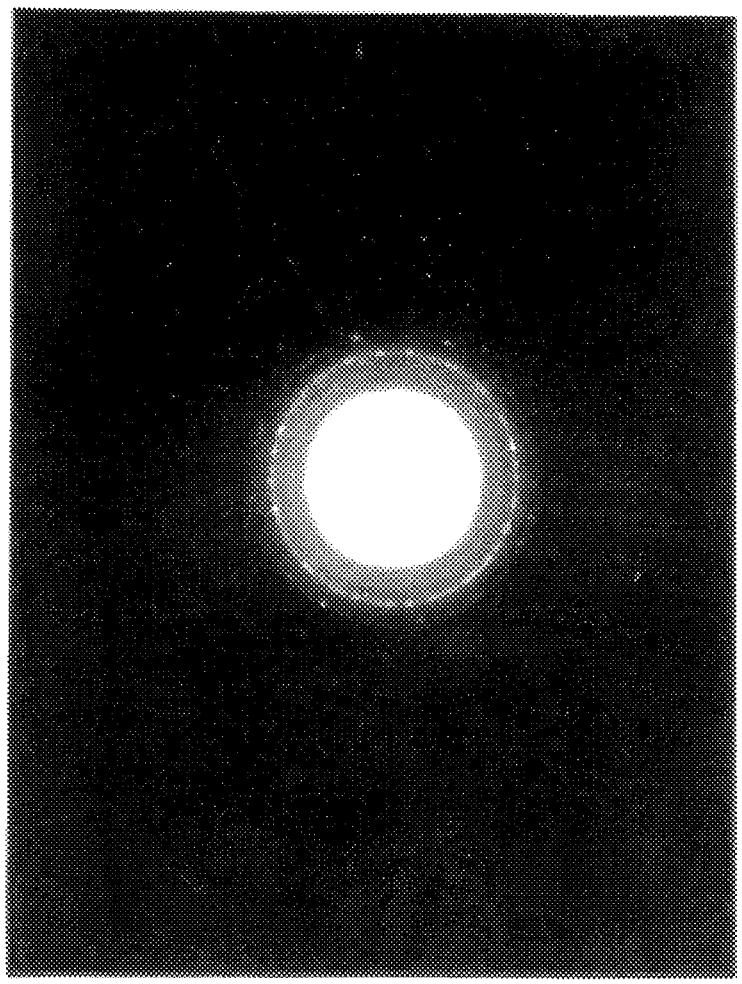
FIG. 8 is a transmission electron diffraction pattern.

FIG. 8 is the transmission electron diffraction pattern of the film. The cross-section and the plan-view electron diffraction data are listed in Table 1. Three peaks match closely to predicted $\beta$-$C_3N_4$ lattice spacings: 2.78 angstroms corresponding to $\beta$-$C_3N_4$ <200>; 1.96 angstroms corresponding to <111> and 1.49 angstroms corresponding to <301>.

TABLE 1

| Cross-section (A) | Plan-view (A) | Calculated (A)** | <hkl> |
|---|---|---|---|
|  | 3.21 | 3.215 | 110 |
|  | 2.80 | 2.784 | 200 |
| 2.53 | 2.53 | 2.46 | 001 |
| 2.06 | 2.11 | 2.104 | 210 |
|  | 1.99 | 1.953 | 111 |
| 1.86 | 1.84 | 1.856 | 300 |
| 1.54 | 1.54 | 1.544 | 310 |
|  | 1.49 | 1.481 | 301 |
|  | 1.39 | 1.392 | 400 |
|  | 1.323 | 1.308 | 311 |
| 1.283 | 1.278 | 1.278 | 320 |
| 1.229 |  | 1.230 | 002 |

TABLE 1-continued

| Cross-section (A) | Plan-view (A) | Calculated (A)** | <hkl> |
|---|---|---|---|
|  | 1.209 | 1.211 | 401 |
|  | 1.147 | 1.149 | 112 |
|  | 1.133 | 1.134 | 321 |
|  | 1.112 | 1.114 | 500 |
| 1.089 | 0.089 | 1.089 | 411 |
|  | 1.056 | 1.052 | 420 |
|  | 0.834 | 0.838 | 521 |
|  | 0.809 | 0.808 | 332 |

**Based on hexagonal lattice parameters, a = 6.43 A and c = 2.38 A.

Thus continuous crystalline films of $\beta$-$C_3N_4$ have been synthesized on a substrate by microwave plasma reaction of graphite and nitrogen. A heterogeneous chemical reaction generates active carbon-nitrogen radicals such as CN*. These species act as precursors which lead to the subsequent crystallization. In this technique, no sputtering, ablation, or thermal dissociation of the graphite was involved. Precipitation of the carbon nitride compound is the result of quenching due to diffusion of the carbon-nitrogen radical precursors out of the plasma region. The unpaired electrons in the radicals tend to bond each species together to form crystals. The microwave plasma provides the generation of radical precursors at appropriate moderate temperatures (600°–1100° C.) to form $\beta$-$C_3N_4$.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

The invention claimed is:

1. An article comprising a substrate having at least one surface and a continuous film of crystalline $\beta$-$C_3N_4$ adhered to at least a portion of said surface.

2. The article of claim 1 wherein said substrate comprises a semiconductor.

3. The article of claim 1 wherein said substrate comprises a metal.

* * * * *